United States Patent
Mar

(10) Patent No.: US 6,294,962 B1
(45) Date of Patent: Sep. 25, 2001

(54) CIRCUIT(S), ARCHITECTURE AND METHOD(S) FOR OPERATING AND/OR TUNING A RING OSCILLATOR

(75) Inventor: Monte F. Mar, Issaquah, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/207,912

(22) Filed: Dec. 9, 1998

(51) Int. Cl.$^7$ ................................................ H03L 7/099
(52) U.S. Cl. ........................ 331/57; 331/176; 331/111; 331/177 R; 331/34; 331/36 C
(58) Field of Search .................... 331/57, 176, 111, 331/177 R, 34, 36 C

(56) References Cited

U.S. PATENT DOCUMENTS

| | | | |
|---|---|---|---|
| 4,061,987 | 12/1977 | Nagahama | 331/111 |
| 4,272,760 | 6/1981 | Prazak et al. | 340/347 |
| 4,344,067 | 8/1982 | Lee | 340/347 |
| 4,692,718 | 9/1987 | Roza et al. | 331/113 R |
| 4,868,525 | 9/1989 | Dias | 331/111 |
| 4,947,169 | 8/1990 | Smith et al. | 341/121 |
| 5,140,197 | 8/1992 | Grider | 307/480 |
| 5,150,079 | 9/1992 | Williams et al. | 331/75 |
| 5,175,884 | 12/1992 | Suarez | 455/260 |
| 5,200,751 | 4/1993 | Smith | 341/147 |
| 5,304,955 | * 4/1994 | Atriss et al. | 331/1 R |
| 5,319,370 | 6/1994 | Signore et al. | 341/120 |
| 5,428,319 | 6/1995 | Marvin et al. | 331/176 |
| 5,440,305 | 8/1995 | Signore et al. | 341/120 |
| 5,546,433 | 8/1996 | Tran et al. | 375/376 |
| 5,552,748 | 9/1996 | O'Shaughnessy | 331/376 |
| 5,563,553 | 10/1996 | Jackson | 331/57 |
| 5,565,819 | 10/1996 | Cooper | 331/111 |
| 5,583,501 | 12/1996 | Henrion et al. | 341/118 |
| 5,594,612 | 1/1997 | Henrion | 341/120 |
| 5,604,466 | 2/1997 | Dreps et al. | 331/113 R |
| 5,666,118 | 9/1997 | Gersbach | 341/120 |
| 5,668,506 | 9/1997 | Watanabe et al. | 331/66 |
| 5,670,915 | 9/1997 | Cooper et al. | 331/111 |
| 5,726,597 | 3/1998 | Petty et al. | 327/307 |
| 5,796,312 | 8/1998 | Hull et al. | 331/44 |
| 5,818,370 | 10/1998 | Sooch et al. | 341/120 |
| 5,825,317 | 10/1998 | Anderson et al. | 341/120 |
| 5,898,345 | 4/1999 | Namura et al. | 331/177 V |
| 6,157,266 | * 12/2000 | Tsai et al. | 331/57 |

OTHER PUBLICATIONS

A 30–MHz Hybrid Analog/Digital Clock Recovery Circuit in 2$\mu$m CMOS, By: Beomsup Kim, David N. Helman and Paul R. Gray, Journal of Solid–State Circuits, vol. 25, No. 6, Dec. 1990, pp. 1385–1394.

WP 3.5: An Integrated Time Reference, By: Robert A. Blauschild, ISSCC94/Session 3, Analog Techniques/Paper WP 3.5., 1994.

* cited by examiner

Primary Examiner—Arnold Kinkead
(74) Attorney, Agent, or Firm—Christopher P. Maiorana, P.C.

(57) ABSTRACT

A current source and a load circuit. The oscillator circuit may be configured to present an output signal having a frequency in response to (i) a current, (ii) a load, and (iii) an input signal. The current source may be configured to generate the current in response to one or more first control signals. The load circuit may be configured to generate the load in response to one or more second control signals.

20 Claims, 2 Drawing Sheets

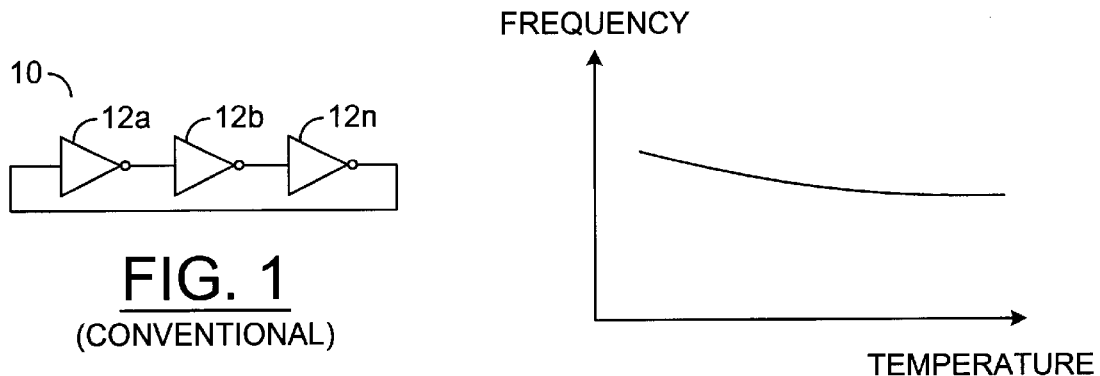
FIG. 1
(CONVENTIONAL)
FIG. 2
(CONVENTIONAL)
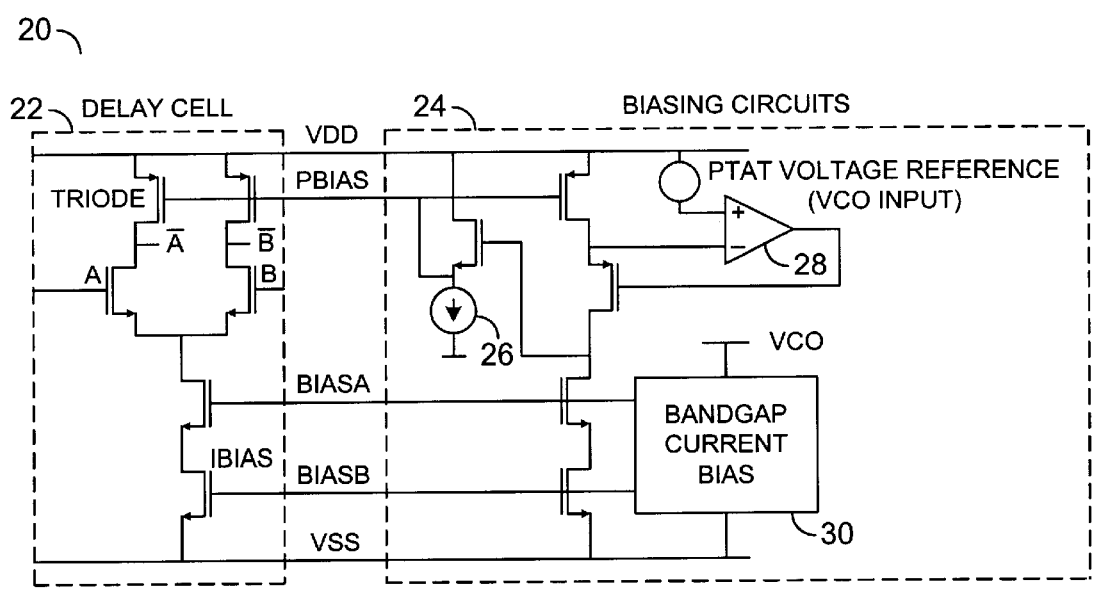
FIG. 3
(CONVENTIONAL)

CIRCUIT(S), ARCHITECTURE AND METHOD(S) FOR OPERATING AND/OR TUNING A RING OSCILLATOR

FIELD OF THE INVENTION

The present invention relates to ocillators generally and, more particularly, to an oscillator that provides a stable output over a range of temperatures without using an external reference such as a crystal.

BACKGROUND OF THE INVENTION

One conventional approach used to implement an oscillator without a crystal is to use a simple resistor/capacitor (RC) network to implement a timer. The original 555 timer chip design used an RC network. However, RC networks are susceptible to process variations and temperature variations. A typical mainline CMOS process does not control resistors or capacitors to tolerances of better than 5%. In some processes, the tolerance is even lower. Laser trimming and other techniques can be used to achieve higher tolerances, but may add to the overall cost of the device.

A second conventional approach used to implement temperature insensitive current sources is described by R. A. Blauschild in his paper entitled AN INTEGRATED TIME REFERENCE, which is hereby incorporated by reference. Such an approach develops a temperature invariant current by using a bias generator that sums currents with different temperature coefficients and combines them with a threshold cancellation circuit. The technique allowed a current that was proportional to oxide thickness. This method was applied to time interval measurement and to filtering, but not to oscillator design.

A third conventional approach used to implement an oscillator is to use a ring oscillator that is stable across process and temperature variations. This is often used in timing recovery PLL circuits. The ring oscillator approach appears to be able to achieve frequency stability on the order of 5%, which is not good enough for a target of 2% or less.

Referring to FIG. 1, a portion of a ring oscillator 10 is shown. The ring oscillator 10 comprises a number of devices 12a–12n. FIG. 2 generally illustrates the temperature dependence of the frequency of oscillation of the devices of the ring oscillator 10. The temperature dependence of the ring oscillator 10 adversely affects the frequency of oscillation.

Referring to FIG. 3, a circuit 20 is shown illustrating a biasing circuit for a delay cell that may be used with a conventional ring oscillator. A delay cell 22 generally presents a signal VDD, a signal PBIAS, a signal BIASA, a signal BIASB and a signal VSS to a biasing circuit 24. The biasing circuit 24 may include a current source 26 that responds to the signal PBIAS. The biasing circuit 24 may provide biasing to a voltage reference circuit 28 that is used as a VCO input. Additionally, a bandgap current bias circuit 30 provides additional biasing to the voltage reference 28. However, while the circuit 20 may be roughly temperature independent, it does not generally provide a high precision frequency of oscillation (i.e., less than 2%).

SUMMARY OF THE INVENTION

The present invention concerns a circuit comprising an oscillator circuit, a current source and a load circuit. The oscillator circuit may be configured to present an output signal having a frequency in response to (i) a current, (ii) a load, and (iii) an input signal. The current source may be configured to generate the current in response to one or more first control signals. The load circuit may be configured to generate the load in response to one or more second control signals.

The objects, features and advantages of the present invention include providing a circuit and method that implements a precision on-chip current controlled oscillator without using an external reference such as a crystal. The present invention provides such an oscillator that (i) provides accurate frequencies (e.g., in the order of 2% or less), (ii) may be used with a ring oscillator to eliminate the need for a resonator or a crystal, (iii) may be used with a microcontroller to provide a single-chip clocking solution for a entire system and (iv) may reduce process sensitivity.

BRIEF DESCRIPTION OF THE DRAWINGS

These and other objects, features and advantages of the present invention will be apparent from the following detailed description and the appended claims and drawings in which:

FIG. 1 is a diagram of a conventional ring oscillator;

FIG. 2 is a frequency versus temperature graph illustrating the temperature dependence of a conventional ring oscillator;

FIG. 3 is a circuit diagram of a conventional biasing circuit for a delay cell;

DETAILED DESCRIPTION OF THE PREFERRED EMBODIMENTS

Figure 4:
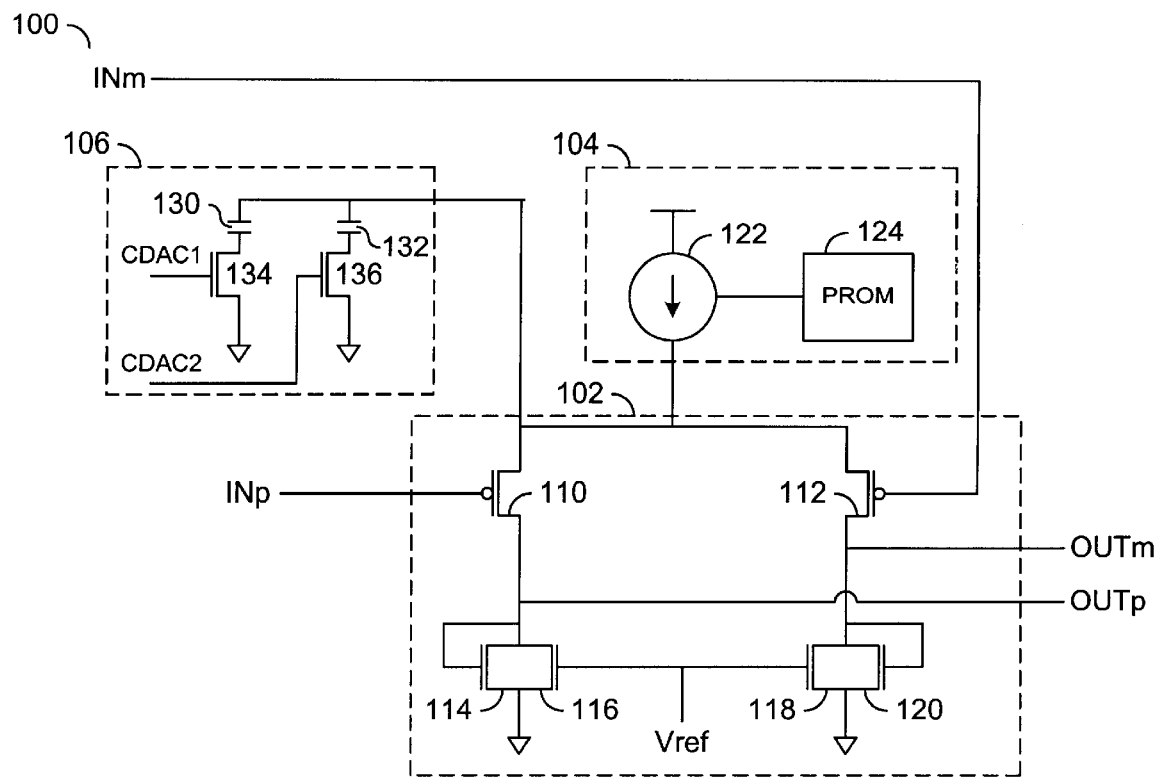
FIG. 4 is a diagram of a preferred embodiment of the present invention.

Referring to FIG. 4, a circuit 100 is shown in accordance with a preferred embodiment of the present invention. The circuit 100 generally comprises an oscillator section (or circuit) 102, a current source section (or circuit) 104 and a load section (or circuit) 106. The oscillator section 102 generally comprises a transistor 110, a transistor 112, a transistor 114, a transistor 116, a transistor 118, and a transistor 120. The transistor 110 and the transistor 112 generally form a differential pair. The transistor 116 and the transistor 118 generally receive a reference voltage (e.g., Vref) at a control gate. The transistor 114 generally has a control gate that may receive the signal from the transistor 110.

The current source section 104 generally comprises a controllable (e.g., adjustable or variable) current source 122 and a programmable element 124. The programmable element 124 generally presents a signal to the current source 122 that may provide temperature calibration for the current source 122. The programmable element 124 may be implemented as a variety of programmable elements, such as a random access memory (RAM), a programmable read only memory (PROM), etc.

The load section 106 generally comprises a capacitor 130, a capacitor 132, a transistor 134 and a transistor 136. The load section 10 may be considered a capacitor digital to analog converter. The transistor 134 may receive a control signal (e.g., CDAC1) at a control gate and the transistor 136 may receive a control signal (e.g., CDAC2) at a control gate. One of the terminals of each of the transistors 134 and 136 is generally coupled to ground while the other terminal is generally coupled to the oscillator section 102, through the capacitors 130 and 132. The capacitors 130 and 132 and the transistors 134 and 136 may be used to implement the capacitor DAC. In one example, the signals CDAC1 and CDAC2 may be generated by a microcontroller (not shown). The microcontroller may adjust the signals CDAC1 and CDAC2, and the reference voltage Vref in response to an oscillation frequency of output signals of the circuit 100 (e.g., OUTM and OUTP).

The circuit 100 may provide, in one example, a CMOS differential pair ring oscillator with a current source 122. The current source 122 may be controlled by the programmable storage element 124. The oscillator circuit 102 may function in a similar fashion to the circuit 10 of FIG. 1 with the additional trimming enhancement provided by the load section 106 and the current source 104. Since the oscillator circuit 102 generally oscillates at a frequency that is temperature dependent, the trimming provides temperature compensation to present a linear outputs OUTM and OUTP.

Figure 5:
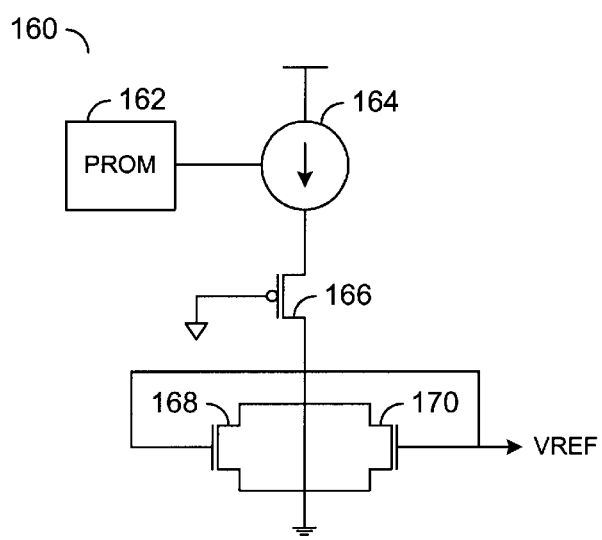
FIG. 5 is a diagram of a bias generator that may be used in connection with FIG. 4.

The current source 122 may be controlled by the PROM 124 to provide one adjustment to the frequency at the outputs OUTM and OUTP. Referring to FIG. 5, a bias circuit 160 may be used to generate the reference voltage Vref as shown. The circuit 160 comprises a PROM 162, a current source 164, a transistor 166, a transistor 168 and a transistor 170. The PROM 162 generally controls the current source 164 that is presented to the source nodes of the differential pair 168 and 170. The transistors 168 and 170 present the reference voltage Vref. The circuit 160 may be referred to as a replica biasing scheme. By changing the PROM 162 setting, the voltage Vref may be kept at a voltage to maintain a regulated swing size. The bias circuit 160 is one example of a biasing scheme. However, other implementations may be used in accordance to meet design criteria of a particular application.

In operation, the current source 122 is set so that the oscillator section 102 has a slightly negative temperature coefficient. The capacitor DAC serves as a load on the swing exhibited at the sources of the transistors in differential pair 110 and 112. Unlike a bipolar differential pair, the voltage at the sources generally exhibits a swing since the gate to source voltage Vgs in the two transistor devices generally changes as different amounts of current are steered through the device. The swing size at this node has a negative temperature coefficient since the threshold voltage Vt of the devices is generally negative. Since the swing size gets smaller, the frequency of oscillation increases slightly as temperature increases. The speedup is generally nonlinear and exhibits a slight curvature for the frequency of oscillation. The speed-up is generally nonlinear. By adding the extra loading of the capacitor DAC, a curvature compensation is achieved. The overall average oscillation frequency goes down as capacitance is added. The large swing at lower temperatures is slowed down more dramatically as more capacitance is added. Thus, if the unloaded oscillator starts with a slight positive temperature coefficient, it may become possible flatten out the temperature sensitivity by adding capacitance.

To provide temperature compensation, a two-step process may be used to program the circuit 100. First, the frequency of oscillation may be roughly set to the desired frequency of operation by adjusting the current source 122 (e.g., a first or coarse frequency calibration). Next, the capacitor DAC 106 may be adjusted in response to the frequency of oscillation of the outputs OUTM and OUTP to find the flattest response (e g., a second or fine frequency calibration). In another example, the fine portion of the frequency may be set by adjusting the signals CDAC1 and CDAC2 to (i) increase the frequency of the signals OUTM and OUTP when the frequency of the signals OUTM and OUTP is below a first predetermined value and (ii) decrease the frequency of the signals OUTM and OUTP when the frequency of the signals OUTM and OUTP is above a second predetermined value.

Over temperature and voltage variations, a precision of about 5% may be achieved using the current source 122. After tuning with the capacitor DAC 106, a tolerance within 1–2% range of a target frequency at a given temperature may be achieved, which is much better than conventional RC oscillator. By implementing the oscillator section 102 as a ring oscillator, a very fast oscillation (e.g., over 100 MHz) may be achieved.

The present invention may provide a capacitive DAC on a source node of a differential pair CMOS ring oscillator that may provide temperature compensation. The present invention may be useful in microcontroller applications where board space limitations are important design constraints. Additionally, the present invention may be applicable in a wider range of applications, such as in lowering temperature coefficients in clock recovery VCOs.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:

an oscillator circuit configured to present an output signal having a frequency in response to (i) a current, (ii) a load, and (iii) an input signal;

a current source configured to generate said current in response to one or more first control signals, wherein a variation of said current calibrates said frequency by setting a coarse frequency; and a digital to analog converter configured to generate said load in response to one or more second control signals, wherein a variation of said one or more second control signals calibrates said frequency by setting a fine frequency.

2. The circuit according to claim 1, wherein said digital to analog converter comprises a load circuit.

3. The circuit according to claim 1, wherein said digital to analog converter comprises a capacitor digital to analog converter.

4. The circuit according to claim 1, further comprising a biasing circuit configured to regulate a swing size of said output signal.

5. The circuit according to claim 1, wherein said one or more first control signals are generated by a programmable element.

6. The circuit according to claim 5, wherein said programmable element is selected from a group consisting of a random access memory cell (RAM), an erasable programmable read only memory (EPROM), and other types of programmable memory cells.

7. The circuit according to claim 1, wherein said digital-to-analog converter (DAC) circuit is configured to respond to said one or more second control signals in response to a microcontroller.

8. The circuit according to claim 7, wherein said microcontroller adjusts said one or more second control signals and a reference voltage in response to said frequency of oscillation of said output signal.

9. A circuit comprising:

means for generating an output signal having a frequency in response to (i) a current, (ii) a load, and (iii) an input signal;

means for generating said current in response to one or more first control signals generated by a programmable element, wherein a variation of said current calibrates said frequency by setting a coarse frequency; and means for generating said load in response to one or more second control signals, wherein a variation of said one or more second control signals calibrates said frequency by setting a fine frequency.

10. A method for generating a signal having an output frequency of oscillation that is temperature insensitive comprising the steps of:

(a) generating said output signal having said output frequency in response to (i) a current, (ii) a load, and (iii) an input signal;

(b) generating said current in response to one or more first control signals generated by a programmable element, wherein a variation of said current calibrates said frequency by setting a coarse frequency; and (c) generating said load in response to one or more second control signals, wherein a variation of said one or more second control signals calibrates said frequency by setting a fine frequency.

11. The method according to claim 10, wherein said load is generated in response to a digital to analog converter.

12. The method according to claim 11, wherein said digital to analog converter comprises a capacitor digital to analog converter.

13. The method according to claim 10, further comprising the step of:

regulating a swing size of said output signal.

14. The method according to claim 10, wherein said programmable element comprises a random access memory cell (RAM), an erasable programmable read only memory (EPROM), or other type of programmable memory cell.

15. The method according to claim 10, wherein said output frequency is calibrated by:

setting said coarse frequency by varying said current; and setting said fine frequency by varying said one or more second control signals.

16. The method according to claim 15, wherein said fine frequency is generated in response to said output frequency.

17. The method according to claim 15, wherein said step of setting said fine frequency comprises:

adjusting said one or more second control signals to increase said output frequency when said output frequency is below a first predetermined value; and adjusting said one or more second control signals to decrease said output frequency when said output frequency is above a second predetermined value.

18. The circuit according to claim 8, wherein microcontroller is further configured to adjust said one or more second control signals to (i) increase said frequency when said frequency is below a first predetermined value or (ii) decrease said frequency when said frequency is above a second predetermined value.

19. The circuit according to claim 9, further comprising:

means for adjusting said one or more second control signals to increase said frequency when said frequency is below a first predetermined value; and means for adjusting said one or more second control signals to decrease said frequency when said frequency is above a second predetermined value.

20. A circuit comprising:

an oscillator circuit configured to present an output signal having a frequency in response to (i) a current, (ii) a load, (iii) a reference voltage, and (iv) an input signal;

a current source configured to generate said current in response to one or more first control signals generated by a programmable element, wherein a variation of said current calibrates said frequency by setting a first frequency; and a load circuit configured to generate said load in response to one or more second control signals, wherein a variation of said one or more second control signals calibrates said frequency by setting a second frequency.

* * * * *